United States Patent [19]

Terashima et al.

[11] Patent Number: 4,816,240

[45] Date of Patent: Mar. 28, 1989

[54] METHOD OF SYNTHESIZING GROUP III ELEMENT-PHOSPHORUS COMPOUND

[75] Inventors: Kazutaka Terashima, Ebina; Masayuki Watanabe; Akinobu Kasami, both of Yokohama, all of Japan

[73] Assignee: Kabushiki Kaisha Toshiba, Kawasaki, Japan

[21] Appl. No.: 45,774

[22] Filed: Apr. 30, 1987

Related U.S. Application Data

[63] Continuation of Ser. No. 843,221, Mar. 24, 1986, abandoned.

[30] Foreign Application Priority Data

Mar. 28, 1985 [JP] Japan .................................. 60-64427

[51] Int. Cl.$^4$ ..................... C01B 25/00; C30B 15/02; C30B 29/40
[52] U.S. Cl. ................................. 423/299; 156/616.1; 156/617.1; 156/624
[58] Field of Search ........... 423/299; 156/607, 416 A, 156/DIG. 85, DIG. 70, 616.1, 617.1, 624

[56] References Cited

U.S. PATENT DOCUMENTS

| | | | |
|---|---|---|---|
| 3,704,093 | 11/1972 | Haggerty et al. | 423/299 |
| 3,777,009 | 12/1973 | Menashi et al. | 156/616 A |
| 4,265,661 | 5/1981 | Ware | 156/616 A |
| 4,496,424 | 1/1985 | Terashima et al. | 156/DIG. 70 |
| 4,528,061 | 7/1985 | Miyazawa et al. | 156/DIG. 70 |

FOREIGN PATENT DOCUMENTS

| | | | |
|---|---|---|---|
| 56586 | 7/1982 | European Pat. Off. | 423/299 |
| 59-88393 | 5/1984 | Japan | 156/607 |
| 59-83999 | 5/1984 | Japan | 156/607 |
| 59-131597 | 7/1984 | Japan | 156/607 |

OTHER PUBLICATIONS

Journal of Crystal Growth, 59(1982)665–668, "A Method for the In-Situ Synthesis and Growth of Indium Phosphide in a Czochralski Puller".

*Primary Examiner*—Gary P. Straub
*Attorney, Agent, or Firm*—Oblon, Fisher, Spivak, McClelland & Maier

[57] ABSTRACT

A method of synthesizing a Group III element-phosphorus compound wherein a mixture of the Group III element and phosphorus is subjected to a liquid-phase reaction under heated and pressurized conditions, thereby forming a polycrystal compound of the Group III element and phosphorus. The compound of Group III element and phosphorus obtained as a result of the liquid-phase reaction may be immediately pull up with a use of a seed crystal to form a monocrystal of the Group III element-phosphorus compound.

1 Claim, 4 Drawing Sheets

METHOD OF SYNTHESIZING GROUP III ELEMENT-PHOSPHORUS COMPOUND

This application is a continuation of application Ser. No. 843,221, filed on Mar. 24, 1986, now abandoned.

BACKGROUND OF THE INVENTION (a) Field of the Invention

The present invention relates to a method of synthesizing a phosphorus compound which is used as a raw material in a pull-up production of monocrystal compound semiconductor, etc., and more particularly to a method of synthesizing Group III element-phosphorus monocrystal compounds in which a Group III element and phosphorus are directly synthesized together.

(b) Description of the Prior Art

GaP monocrystal is a semiconductor having a relatively large energy gap among others of the Group III-V compound semiconductor, and allows an easy control of the n and p conductive type control is relatively simple, and is therefore used as a raw material of light emitting diodes. However, the production of GaP offers various problems in synthesis, and therefore the production of GaP monocrystal has been extremely difficult. That is, phsosphide has a high melting temperature, as is well known, and more over it exhibits a high decomposition pressure at that melting temperature. Accordingly, in the conventional method, phosphorus is vaporized so that the compound thereof decomposes causing it difficult to produce GaP monocrystal.

Recently, a method generally known as "a high pressure pull-up method under a liquid encapsulate", has become applicable in the industrial production of monocrystal of phosphide such as, for example, GaP, etc.. In this method, the top of GaP polycrystal which has been synthesized beforehand and received in a crucible is covered with $B_2O_3$ having a low vapor pressure, and is then pressurized with the use of inert gas within the high pressure container. Under this condition the crucible is heated to melt GaP. At this stage $B_2O_3$ covers the top surface of GaP to prevent phosphorus from vaporizing. In this condition GaP monocrystal is pulled up through $B_2O_3$ (an encapsulate) to allow the growth of GaP monocrystals.

However, in this method, the GaP polycrystal should be preliminarily synthesized by other means. Accordingly, in order to manufacture a high quality GaP monocrystal at a low cost, it is necessary to prepare a high quality GaP polycrystal at a low cost.

By the way, there have been proposed low pressure synthesis method for synthesizing GaP polycrystal. For example, in one of the methods, the gas of $H_2 + PH_3$ is allowed to flow over Ga in a boat disposed within a heating furnace while Ga is heated up to a temperature of about 1000° C. GaP then is gradually synthesized from one end of the boat by inducing a temperature difference of 100° C. between both ends of the boat. In another of the methods, $GaPO_4$ is fired and reduced in a hydrogen atmosphere at a temperature of 850° C. However, GaP polycrystals obtained by these methods are powder-like, so that the GaP polycrystals thus obtained should be further processed into a high-density before they are pull up to form a monocrystal thereof, resulting in that the steps are complicated and the price of the product increases.

Meanwhile, there has also been proposed a high pressure synthesis method of high dense GaP polycrystal suitable for pulling up monocrystal, in which Ga is heated under a high vapor pressure of phosphorus to synthesize GaP polycrystal. In this method, red phosphorus is disposed in an open end of a high-pressure resistant sealed pipe laid in an electrical furnace, while a container disposed therein with Ga is arranged at the other end of the sealed pipe, then red phosphorus is heated up to a temperature of about 600° C. to saturate the inside of the sealed pipe with the phosphorus vapor. The vapor is then reacted with Ga which has been locally heated up to a temperature near the melting point of GaP (up to 1467° C.), thereby gradually synthesizing GaP polycrystal. However, although this high-pressure method may produce highly-dense GaP polycrystal, it is accompanied with a disadvantage in that a stoichometric composition cannot be obtained since the control of gas-pressure of phosphorus vapor is very difficult.

Further, both low and high pressure synthesis methods mentioned above require a long time (several days) for the synthesis of GaP polycrystal, and therefore, not only incurs low productivity and an increase in cost but, also presents the problem of contamination in a reaction system since the reaction system must be maintained at a high temperature for a long time.

It is noted here that the above-mentioned problems are not limited to the production of GaP but also with the production of other Group III-V compound semiconductor, such as, for example, InP, GaAsP, etc. or a compound of Group III element and phosphorus.

SUMMARY OF THE INVENTION

The present invention is accomplished in view of the above-mentioned problems. One object of the present invention is to provide a method of synthesizing a compound of Group III element and phosphorus in which a highly-dense polycrystal composed of the compounds of Group III elements and phosphorus can be produced with a high degree of efficiency in a short time, the introduction of impurities from a reaction system can also be reduced, and the production cost of the compound can be reduced.

Accordingly, the present invention provides a method of synthesizing a Group III element-phosphorus compound, which comprises the steps of disposing a mixture of a Group III element and phosphorus in a pressurized inert gas atmosphere; and subjecting the mixture of the Group III element and phosphorus to a liquid-phase reaction under a heated and pressurized condition, thereby forming a polycrystal compound of a Group III element and phosphorus.

Further, the present invention is to provide a method of synthesizing a Group III element-phosphorus compound, which comprises the steps of disposing a mixture of a Group III element and phosphorus in a pressurized inert gas atmosphere; subjecting the mixture of the Group III element and phosphorus to a liquid-phase reaction under a heated and pressurized condition, thereby forming a compound of a Group III elements and phosphorus; and pulling up with the use of a seed crystal a Group III element-phosphorus compound monocrystal under such conditions that the top surface of the Group III element-phosphorus compound is covered with an encapsulating layer.

DESCRIPTION OF THE PREFERRED EMBODIMENTS

The gist of the present invention is in that a Group III element and phosphorus are subjected to a liquid-phase reaction for direct synthesis.

Phosphorus normally exists as two allotropes of yellow phosphorus and red phosphorus under normal temperature and pressure. Red phosphorus has a stable phase in comparison with yellow phosphorus having its melting point around 44° C., and spontaneously ignites in the air. Yellow phosphorus, or liquid phosphorus, has a metastable phase, and therefore, when its temperature reaches a temperature of around 250° C. or when ulraviolet ray is irradiated, it is converted into red phosphorus and is solidified. On the contrary, when the mentioned above conditions are avoided, yellow phosphorus and liquid phosphorus remain in their stable conditions for a long time.

Figure 3:
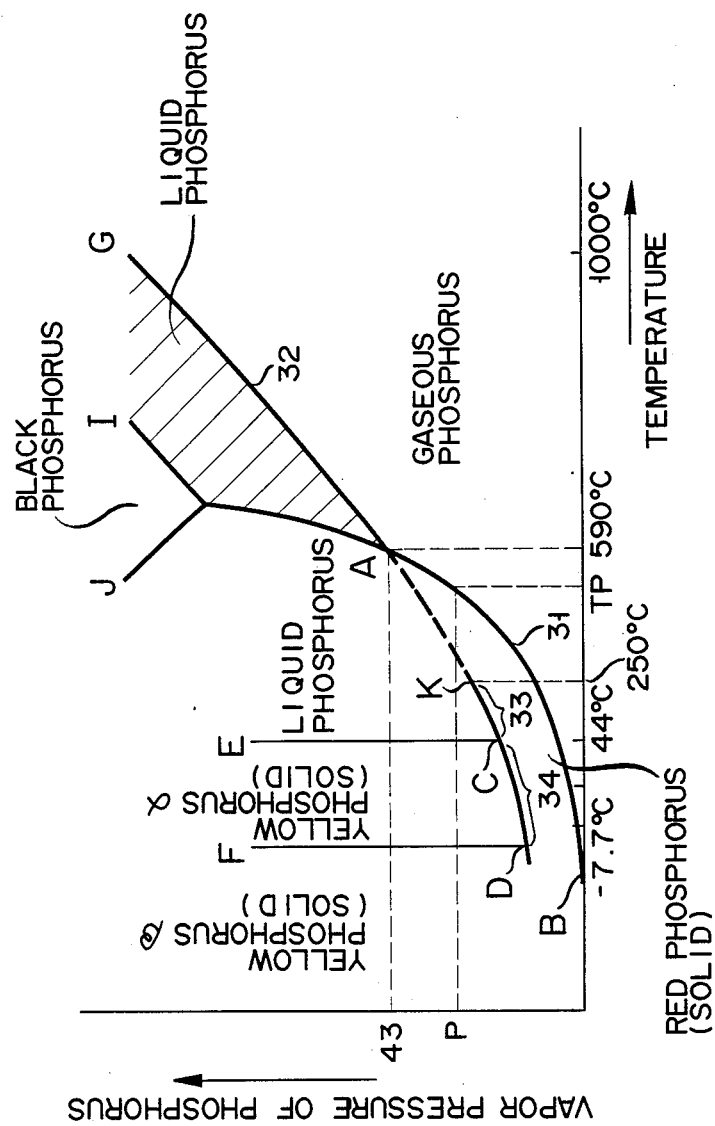
FIG. 3 is a graph which shows the relationship between vapor-pressure of phosphorus and temperature to explain the principle of the present invention.

FIG. 3 is a phase diagram of a phosphorus on which the relationship among red phosphorus, yellow phosphorus and liquid phosphorus is shown. Referring to FIG. 3 the curve 31 of A-B is the curve of vapor-pressure of red phosphorus, in which it is found that red phosphorus has a stable phase at a pressure less than about 43 atm. and at a temperature of less than 590° C. Meanwhile, on the extension of the line 32 of G-A, which is a vapor-pressure curve of the liquid phase-gas phase, there exists the phase of metastable liquid phosphorus, and in the areas having a temperature lower than that, there exists the phase 33 of yellow phosphorus having a solid phase. If the temperature of the solid phase yellow phosphorus is raised at normal pressure, it melts at a temperature of about 44° C. and is changed into its liquid state. In this condition it is comparatively stable in the form of liquid phosphorus, but as the temperature gradually rises up to above 250° C., liquid phosphorus abruptly changes into red phosphorus. There is a certain area in which the condition of liquid phosphorus is stably maintained at a temperature above 590° C. and at a pressure above 43 atm, which is shown as a hatched area in the drawing.

According to the present invention, this liquid phosphorus is subjected to a liquid-phase reaction by externally heating a Group III element such as, for example, Ga, while the liquid phosphorus is maintained in a stable condition under a high pressure. Utilizing the above-mentioned liquid-phase exothermal reaction phenomenon between the Group III element and phosphorus, the temperature thereof can be locally raised without requiring a large amount of external heating to a temperature near the melting point of phosphide to greatly promote the reaction of the Group III element and phosphorus. It is thereby possible to instantly complete the synthesis of the polycrystal compound.

As to the inert gas atmosphere, any inert gas other than $N_2$ gas may be used. However an inert gas such as, for example, Ar gas, which incurs high frequency electric discharge, is not preferable. In view of the economical point and availability, $N_2$ gas is the most preferable. The pressure and heating temperature of the inert gas atmosphere should be set in a range of 130 to 700 atm. and in a range of 600 to 1450° C. for the reaction.

It is noted here that, although the pressure and temperature of the inert gas atmosphere are set at 700 atm. and at 1450° C. as their upper limits, values exceeding these limits are not always ineffective to progress the reaction. However, in view of the arrangement of the device, it is desirable and sufficient for satisfying conditions necessary for synthesis to use a pressurization below 700 atm. and a temperature below 1450° C. Further, although the lower limits are set at 130 atm. and 600° C. These values are merely necessary conditions for promoting smooth and sufficient synthesis. For example, at a pressure below 130 atm. Phosphorus is liable to be scattered, and at a temperature below 600° C. the synthesis tends to be slightly insufficient, resulting in unreactants being present and scattered. Further, the optimum pressure and temperature can be suitably set in accordance with the kind of Group III elements to be used. For example, if Gallium is selected to be used among Group III elements, the pressure of the inert gas should be set within a range of 300 to 700 atm, and the temperature within a range of 700 to 1450° C., more preferably 1300 to 1450° C. Further, if Indium is selected as a Group III element, the pressure of the inert gas is preferably set within a range of 130 to 600 atm., more preferably 150 to 200 atm, and the temperature within a range of 600 to 1200° C., more preferably 1100 to 1200° C.

According to the present invention, process contamination may be eliminated, and therefore, phosphorus compound polycrystal (Group III-V compound semiconductor) having a high purity can be synthesized directly from a high purity Group III element and phosphorus. It is therefore possible to obtain high-density polycrystal suitable for pulling up Group III-V monocrystal semiconductor, in conformity with the shape of a crucible used for pulling up monocrystal. Further, the Group III element-phosphorus compound produces within the crucible, according to the method of the present invention, can be directly pulled up from the crucible with the use of a seed crystal, and the Group III element-phosphorus compound can be obtained as a monocrystal.

Further, according to the present invention, since the process of the synthesis is simple and therefore, can be completed in a short time, a large amount of phosphorus compound polycrystal or monocrystal can be produced at low cost thereby making the present invention a great contribution to the industries.

EMBODIMENT OF THE INVENTION

The present invention will be explained in more detail with reference to one embodiment shown in the drawings.

Figure 1:
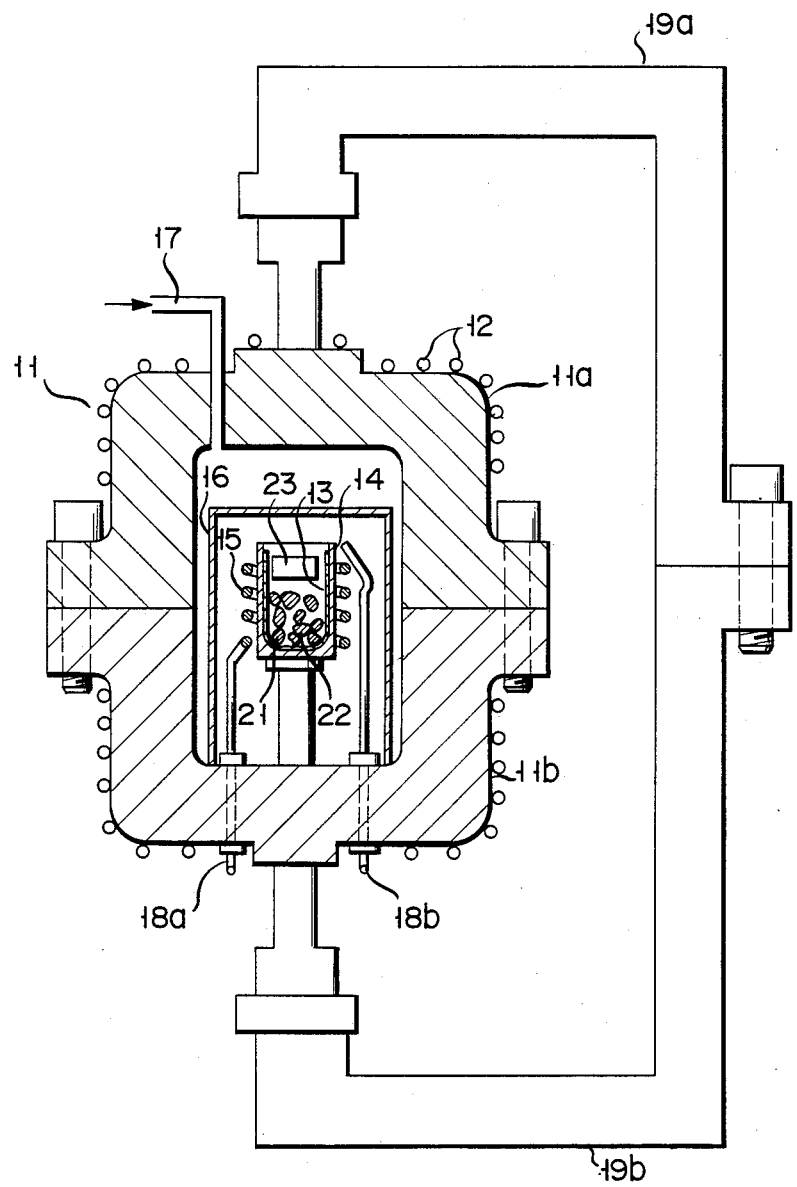
FIG. 1 is a cross-sectional view which schematically shows a GaP polycrystal synthesizing device used in one embodiment of the present invention.

FIG. 1 is a cross-sectional view which schematically shows the arrangement of a GaP polycrystal synthesizing device used in one embodiment of the invention. In the figure, reference numeral 11 denotes a high pressure chamber composed of chamber members 11a, 11b made of stainless steel and charged therein with molybdenum. The chamber members 11a, 11b are fastened together with screws, etc. The chamber 11 is surrounded by a cooling pipe 12 laid along the peripheral surface thereof. In the chamber 11 is housed a crucible 13 in which raw materials 21, 22 and a encapsulating material 23 are stored as explained hereinbelow. The crucible 13 is supported by a suscepter 14 around which a high frequency heating coil 15 is arranged. Further, the heating coil 15 is surrounded by a heat-insulating plate 16.

Further, in this figure, reference numeral 17 denotes a gas introduction port through which inert gas such as $N_2$ gas is introduced. 18a, 18b denote electrodes for feeding the current to the coil 15, and 19a; 19b is the pressurizing mechanism for preventing the chambers 11 from exploding.

Explanation will be further made on the methods of synthesizing GaP polycrystal and InP monocrystal with the use of the above-mentioned device.

SYNTHESIS EXAMPLE 1

[Synthesis of GaP polycrystal]

At first, 500g of lump-like 6N-grade phosphorus 21 having a diameter of about 10mm was disposed in a lower portion of the quartz crucible 13 having a diameter of 100mm and a depth of 100mm. 1kg of 6N grade high purity Ga 22 was laid on the phosphorus layer and about 300g of $B_2O_3$ of low moisture (e.g. less than 50ppm of water) was laid on raw materials 21, 22. The above-mentioned crucible 13 was then disposed in the suscepter 14 made of carbon over which the heat-insulating plate 16 was covered, and then the chamber 11 was secured by means of screws. After the inside of the chamber 11 was evacuated (e.g. up to $2 \times 10^{-5}$ torr), a high purity $N_2$ gas was introduced and compressed with about 250 atm. in the chamber 11 with the use of a pressurizing unit. Thereafter, with the use of the high frequency coil 15 (power source frequency of 500Hz), the crucible 15 was heated.

Figure 2:
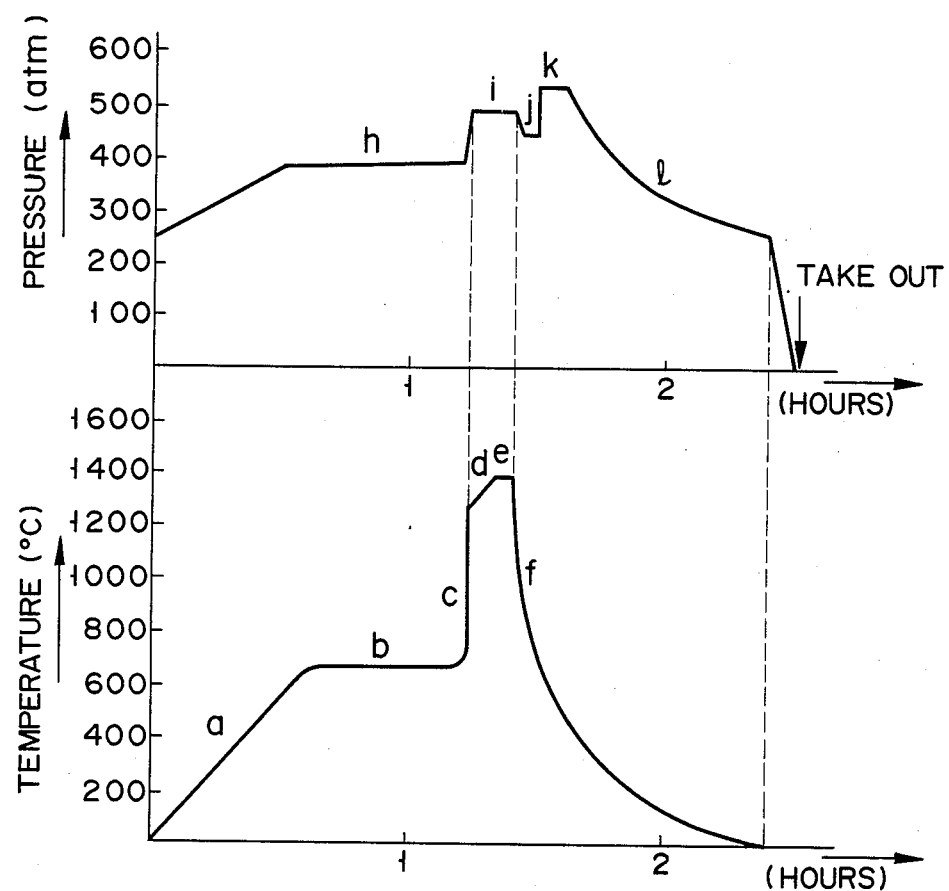
FIG. 2 is a graph which shows a pressure pattern and a heating pattern to explain the production of GaP polycrystal with the use of the device shown in FIG. 1.

FIG. 2 shows one example of the heating patterns together with one example of the pressure patterns. At first the raw material 21, 22 and the encapsulating material 23 within the crucible 13 were gradually heated (in area a), and then the power for heating was temporarily held at the temperature at which $B_2O_3$ soften so as to cover the raw material (in area b). Further, after $B_2O_3$ was conditioned to sufficiently suppress the evaporation of phosphorus, synthesis was rapidly carried out (in the area c). Thereafter, heating was continued until synthesis was completed (in the area d: the pressure in this stage was 480 atm.). Upon completion of synthesis, the heating of the raw materials was stopped and the resultant product was rapidly cooled (in the area f). In simultaneous with the cooling process, the internal pressure of the chamber was increased up to 540 atm. in order to prevent phosphorus from excessively scattering upon solidification of the molten liquid.

When the atmosphere in the crucible cooled down, the pressure in the chamber 11 was lowered, and thereafter, when the chamber 11 was disassembled, it was confirmed that GaP polycrystal was produced in the crucible.

Thus, according to the method in the embodiment of the present invention, by direct synthesis with Ga and P a lump-like GaP polycrystal can be produced and the time required for synthesis remarkably shortened. Further, process contamination has extremely decreased, therefore high quality GaP polycrystal can be produced in large amounts. Consequently. it is possible to produce, at a low cost, lump-like GaP polycrystal as the raw material, which is optimum for producing GaP monocrystal with the use of the LEC method.

Further, the composition ratio of Ga and P can be controlled. The inventors have tried to obtain a charge ratio which is optimum for a light-emitting diode substrate.

When condition A, in which the charge ratio was Ga:P =1:1.1 (molar ratio), and condition B, in which the charge ratio was Ga:P =1:1.3 (molar ratio), were compared, the diffusion of boron from $B_2O_3$ into the product in the condition A was larger than the condition B while the diffusion of impurities from the crucible material in the condition A was larger than the condition B. That is, polycrystal of higher purity can be obtained under the condition of excessiveness of P. Further, even in the LEC method in which monocrystal is actually produced, monocrystal of high quality having for less amount of precipitation and voids can be obtained with the use of the polycrystal line raw material which is produced by the method of the present invention.

SYNTHESIS EXAMPLE 2

[Synthesis of InP Monocrystal]

Figure 4:
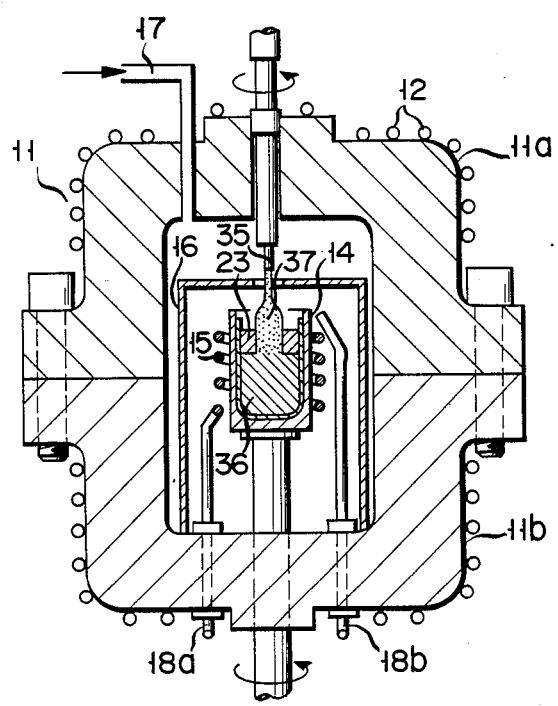
FIG. 4 is a cross-sectional view of the device shown in FIG. 1 which shows another movement of the device when monocrystal is directly pulled up.

500g of 6N grade lump-like phosphorus having a diameter of about 10mm was disposed in a crucible which was similar to that mentioned in the Synthesis Example 1. 850g of high purity 6N grade In was laid thereabove, and then, 300g of $B_2O_3$ having a moisture content of less than 5ppm was further laid thereover. After this crucible was disposed in the chamber, as mentioned in the Synthesis Example 1, the reaction was allowed to proceed under a $N_2$ gas atmosphere at a pressure of 150 to 200 atm. and at a temperature of 1150 C. Thereafter the pressure in the chamber was lowered to less than 100 atm. e.g. 50 atm., and a temperature of 1130° C. was maintained. Seed crystal 35 was gradually lowered into the crucible from the top of the chamber, then was introduced through the $B_2O_3$ layer 21 into InP 36, in a molten state as shown in FIG. 4, to make the seed crystal 35 affinitive to the InP 36 (or while adjusting the temperature of molten InP 36 to its affinitive temperature). Finally the seed crystal 35 was gradually pulled up while being rotated, to promote the growth of monocrystal 37. In FIG. 4, the same reference numerals are used to indicate the same component parts shown in FIG. 1.

As a result, about 800g of InP monocrystal having (111) orientation was obtained from about 1kg of the Inp liquid in a molten state. When InP thus obtained was analyzed as to its impurities, and it was confirmed that high purity monocrystal, in which the amount of impurities was less than 0.01ppm (atms) was obtained. It is noted here that although $B_2O_3$ encapsulating material was used in the above-mentioned Reference Example 1, this encapsulating material is merely required to pull up monocrystal immediately after the synthesis of the compound product. Therefore, as far as synthesis of polycrystalline product alone is concerned, it is possible to sufficiently supress the scattering of P without employing any encapsulating material. Further, it is natural that the present invention cannot only be applied to the synthesis of GaP and InP, but also to the synthesis of the other Group III element-phosphorus compound crystals, such as $Ga_2AsP$ etc. Further, the device used for the synthesis is not limited to the above-mentioned device, as shown in FIG. 1, but any other device can be selectively used.

What is claimed is:

1. A method of synthesizing an indium-phosphorus compound, consisting essentially of:

disposing a mixture consisting of indium and phosphorus at a ratio of 1.1 moles or more of phosphorus per mole of indium in a crucible;

subjecting the mixture to a liquid-phase reaction at a temperature of from 600 to 1200° C. under a pressurized inert gas atmosphere of from 130 to 600 atm.;

rapidly cooling the crucible, while increasing the pressure after a slight decrease of the pressure occurring immediately after termination of the reaction; and then gradually lowering the temperature and the pressure and recovering a polycrystalline compound of indium and phosphorus.

* * * * *